United States Patent [19]

D'Aiello

[11] 4,112,457

[45] Sep. 5, 1978

[54] PHOTOVOLTAIC DEVICE HAVING AN EXTENDED PN JUNCTION

[75] Inventor: Robert Vincent D'Aiello, East Brunswick, N.J.

[73] Assignee: RCA Corporation, New York, N.Y.

[21] Appl. No.: 737,915

[22] Filed: Nov. 1, 1976

[51] Int. Cl.² .................................... H01L 31/06
[52] U.S. Cl. ............................ 357/30; 136/89 SJ; 357/20
[58] Field of Search ..................... 357/30, 20, 89; 136/89 CC, 89 SJ

[56] References Cited

U.S. PATENT DOCUMENTS

| | | | |
|---|---|---|---|
| 3,278,337 | 10/1966 | Gault | 357/30 X |
| 3,969,746 | 7/1976 | Kendall et al. | 357/30 |

OTHER PUBLICATIONS

Hovel et al., "Method for Si and GaAs Solar Cell Diffusion", *IBM TDB*, vol. 16, No. 7, Dec. 1973, pp. 2083–2084.

*Primary Examiner*—Stanley D. Miller, Jr.
*Assistant Examiner*—James W. Davie
*Attorney, Agent, or Firm*—H. Christoffersen; Birgit E. Morris

[57] ABSTRACT

A photovoltaic device having essentially only a body of semiconductor material having a first region of one conductivity type in contact with a second region of the opposite conductivity type, forming a portion of the device PN junction therebetween. A plurality of pocket regions of the same conductivity type as the first region extend into the second region thereby further defining a portion of the PN junction in the second region.

5 Claims, 2 Drawing Figures

PHOTOVOLTAIC DEVICE HAVING AN EXTENDED PN JUNCTION

BACKGROUND OF THE INVENTION

This invention herein described was made in the performance of work under a NASA contract and is subject to the provisions of section 305 of the National Aeronautics and Space Act of 1958, Public Law 85-568 (72 Stat. 435; 42 U. S. C. 2457).

The present invention relates to photovoltaic devices and more specifically to photovoltaic device having enhanced collection efficiency.

The conventional photovoltaic device, for example a solar cell, has a first layer of N type conductivity on a second layer of P type conductivity forming a PN junction therebetween. The first layer has an incident surface, opposite the PN junction. Solar radiation impinges the device at the incident surface. The solar cell absorbs the radiation and converts the photon energy into electrical energy. In the past, the design effort with respect to such conventional photovoltaic devices was directed toward optimizing the N type conductivity first layer in order to enhance the collection efficiency of the short wavelength portion of the solar spectrum. Specifically, such optimization was achieved by making the first layer as thin as possible, e.g. ¼ to ½ micron in thickness, but of good crystalline quality so as to maximize the collection of hole-electron carriers generated by photons having wavelengths in the range of 3,500 to 4,500 Angstroms (Å). This short wavelength portion of the solar spectrum is absorbed close to the incident surface. Attempts have also been made to enhance the collection efficiency of the long wavelength portion of the solar spectrum, i.e., 8,000 to 11,000Å, by providing either optical or generated carrier reflectors at or near the back contact, i.e., the contact opposite the incident surface. However, these methods usually involve restrictions in the thickness of the second layer, and restrictions in the resistivity of the second layer, or special construction of the back surface. It would be most desirable in the photovoltaic art to have a device wherein the long wavelength optical response of the device can be optimized without the necessity of thickness and resistivity restrictions to the second layer.

SUMMARY OF THE INVENTION

A photovoltaic device consisting essentially of a body of semiconductor material which includes a first region of one conductivity type, a second region of the opposite conductivity type contiguous to the first region, and a plurality of pocket regions of the one conductivity type. The first region has an incident surface where incident radiation is capable of impinging the device. The second region, contiguous to the first region, defines a portion of the PN junction therebetween. The pocket regions are electrically coupled to the first region. The pocket regions defining with the second region further portions of the PN junction. The pocket regions extend into the second region thereby extending said PN junction into said second region.

DETAILED DESCRIPTION OF THE INVENTION

Figure 1:
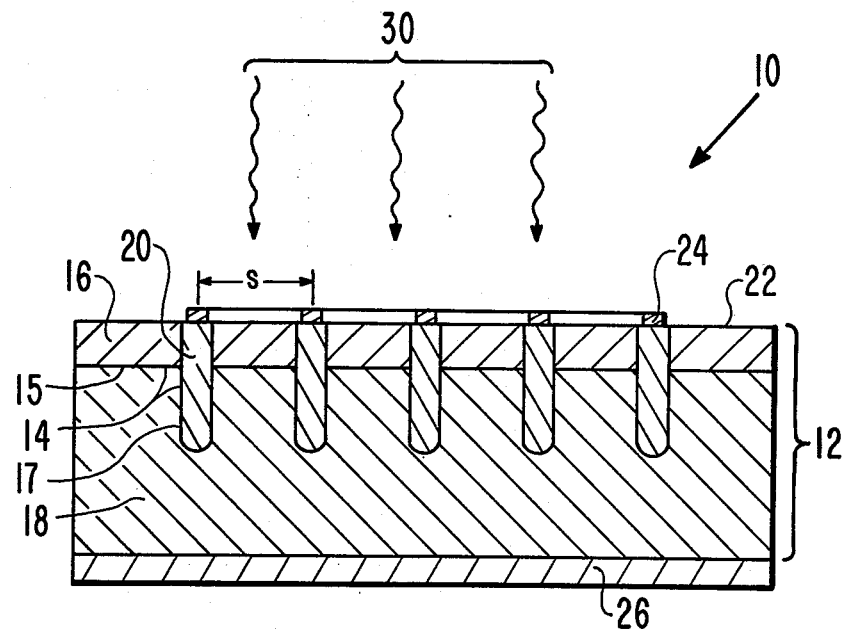
FIG. 1 is a cross-sectional view of an embodiment of the photovoltaic device of the present invention.

Referring to FIG. 1, a first embodiment of the photovoltaic device of the present invention is designated as 10. The photovoltaic device 10 could be for example a solar cell or photodetector, but for purposes of explaining the present invention, it is assumed that the device 10 is a solar cell. The photovoltaic device 10 includes a body 12 of semiconductor material such as silicon, and a PN junction 14. The body 12 includes a first region 16 of semiconductor material of one conductivity type of a predetermined degree, a second region 18 of semiconductor material of the opposite conductivity type contiguous to the first region 16, and a plurality of pocket regions 20 extending from the first region 16 into the second region 18. The pocket regions 20 are of the same conductivity type as the first region 16 and typically are of a higher impurity concentration. Thus, assuming the first region 16 is of N type conductivity, e.g. $10^{19}$ atoms/cm$^3$, the second region 18 is of P type conductivity, e.g. $10^{15}$ atoms/cm$^3$ and the pocket regions 20 are of N+ type conductivity, e.g. $10^{20}$ atoms/cm$^3$. The "N+" means the pocket regions 20 have a higher surface impurity concentration than the first region 16. The first and second regions 16 and 18 form therebetween a portion 15 of the PN junction 14, and the second region 18 and pocket regions 20 form therebetween the remaining portion 17 of the PN junction 14. The pocket regions 20 are electrically coupled to the first region 16. The first region 16 has an incident surface 22 on which incident solar radiation can enter the body 12.

A series of contacts comprising a first electrode 24 is on the pocket regions 20 at the incident surface 22. The first electrode 24 is typically comb shaped and of a metal, such as gold or silver, having good electrical conductivity and which is compatible with the body 12. A second electrode 26 is on the surface of the second region 18 opposite the incident surface 22. The second electrode 26 is also typically of a metallic material, such as aluminum, having good electrical properties and also compatible with the semiconductor material of body 12.

In the operation of the photovoltaic device 10, solar radiation 30 enters the device 10 at the incident surface 22. As is well known to those in the solar cell art, the shorter wavelength portion of the solar spectrum contains photons of a higher energy level than the longer wavelength portion of the solar spectrum. The higher energy photons are more readily absorbed near the incident surface 22 of the semiconductor material of the body 12. Typically, the photons of the short wavelength portion of the solar spectrum are absorbed by the body 12 in the vicinity of the incident surface 22. Thus, the carriers generated by the absorption of the short wavelength radiation are readily collected by portion 15 of the PN junction 14 formed by the first region 16 and second region 18. It is also well known to those in the solar cell art that the photons of the long wavelength portion of the solar spectrum must travel farther into the body 12 to be absorbed and thereby generate carrier pairs. The collection of photogenerated carriers at the junction results in the electrical energy of a solar cell. In a conventional solar cell structure, approximately 63% of carriers generated at one diffusion length from the PN junction are lost to recombination before they actually reach the PN junction. The probability of collecting carriers at a distance more than a diffusion length from the PN junction decreases with increasing distance. Therefore, the advantage of the pocket regions 20 is that they extend the PN junction 14, specifically the portion 17, farther into the body 12 so as to increase the probability of collecting photogenerated carriers farther into the body 12. That is to say, carriers generated at a depth of about a diffusion length or greater from portion 15 of the PN junction 14 can now more readily be collected as usable electrical current, due to the extended portion 17 of the PN junction 14.

In determining the center to center spacing between the pocket regions 20, designated as "s", it is a good rule of thumb to assume that carriers generated from approximately 1 to 1½ diffusion lengths from the PN junction have an acceptable probability of being collected by the PN junction. If one is to rely on this rule of thumb then typically, in designing the photovoltaic device 10 of the present invention, the center to center spacing between pocket regions 20 will be in the range of 1 to 3 diffusion lengths in order to optimize carrier collection efficiency.

It is desirable that the pocket regions 20 extend as deep as possible into the second region 18. However, the depth of the pocket regions 20 into the second region 18 is limited by breakdown mechanisms which can occur when the pocket regions 20 come in contact with or are too close to the second electrode 26. Specifically, device 10 breakdown can occur by shorting-out the PN junction 14, by avalanch injection or by zener breakdown, if the pocket regions 20 extends too close to the second electrode 26.

The diffusion rate of the dopant into the semiconductor material of body 12 also has an impact on the depth of the pocket regions 20. For some semiconductor materials, the diffusion rate is so slow that diffusing an impurity into the body to a distance in the body short of causing a breakdown mechanism to occur, would take a day or more. Thus, in such a situation it may be more practical from a production point of view to form pocket regions 20 of a shorter depth into the second region 18. For example, since diffusion into silicon may be rather slow, it may be more preferable that the pocket regions 20 have a depth from the incident surface 22 into the second region 18 of about ½ a diffusion length.

In the fabrication of the photovoltaic device 10, a body of semiconductor material, such as silicon, is selected of the same conductivity type as the second region 18, e.g., P type conductivity. In a typical fabrication sequence, the pocket regions 20 are formed in the wafer by using conventional photolithographic techniques which include etching slits in a thermal or oxide mask which is deposited or grown on what is to be the incident surface 22 of the body 12. By conventional diffusion techniques an impurity, e.g., phosphorus, of the same conductivity type as the first region 16 but typically of a higher impurity concentration is then diffused into the body 12 through the slits forming the pocket regions 20. The slits in the diffusion mask will usually be less than 25 microns wide so that the diffusion is more in a perpendicular path into the body 12 rather than in a lateral path across the body 12. Next, the first region 16 is formed in the body 12 by conventional diffusion techniques, thereby defining both first region 16 and second region 18. Alternatively, the first and second regions 16 and 18 can also be formed by conventional liquid or vapor phase epitaxy. The first electrode 24 is then formed on the incident surface 22, and the second electrode 26 is formed on the surface opposite the incident surface 22 by conventional masking and evaporation techniques.

As is well known to those in the solar cell art, the first electrode 24 can prevent solar radiation from impinging the body 12 by either reflecting such radiation away from the cell 10 or by shadowing the radiation. Thus, in a conventional solar cell that portion of the cell's body under the first electrode would be essentially an unused portion of the body. However, an advantage of the photovoltaic device 10 of the present invention is that this conventionally unused portion of the body 12 is now used to extend the PN junction 14 farther into the body 12.

Other advantages of the present invention is that if the thickness of body 12 is the same as that of a conventional solar cell, the extended PN junction results in an overall increased cell collection efficiency. Furthermore, the thickness of the body 12 of cell 10 can be increased over the thickness of conventional solar cells with a larger increase in carrier collection efficiency than would be observed by increasing the thickness of the body of a conventional solar cell.

Figure 2:
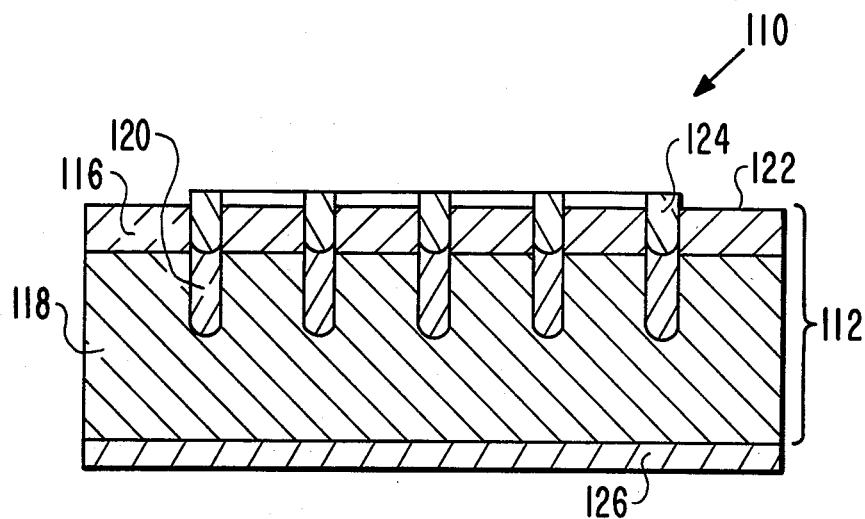
FIG. 2 is a cross-sectional view of another embodiment of the photovoltaic device of the present invention.

Referring to FIG. 2, a second embodiment of the photovoltaic device of the present invention is designated as 110. The photovoltaic device 110 includes a body 112 having a first region 116 and a second region 118. In this embodiment, the plurality of pocket regions 120 in the body 112 extend from some point below the incident surface 122 but within the first region 116 and extend into the second region 118. An advantage of the second embodiment 110 is that in those situations where there is a practical limitation on the length of the pocket regions 120, the second embodiment 110 can provide pocket regions 120 deeper into the second region 118 than can be provided in the first embodiment 10. Thus, the farther below the incident surface 122 is the point of commencement of the pocket regions 120, the farther the pocket regions 120 can extend into the second region 118.

A first electrode 124 is in the first region 116 electrically contacting both the pocket regions 120 and the first region 116. The shape of the electrode 124 is the same as that of the first electrode 24 of the first embodiment with the exception that at least part of it is below the incident surface 122. A second electrode 126 is on the surface of the body 112 opposite the incident surface 122.

In the fabrication of the second embodiment 110 a body of semiconductor material of the conductivity type desired for second region 118, e.g. P type silicon, is subjected to conventional etching techniques, thereby forming grooves in a surface of the body. The location of the etched grooves correspond to the positions of the pocket regions 120. Then by conventional masking and diffusion techniques an impurity dopant is diffused into said grooves of body 112 to the desired depth, thereby forming pocket regions 120. The pocket regions 120 extend into the body 112 from the bottom of the etched grooves. The first region 116 can then be formed by conventional diffusion or epitaxial techniques. The forming of first region 116 also defines the second region 118 in the body 112. The first region 116 extends into body 112 deeper than the depth of the etched grooves. The first electrode 124 and second electrode 126 are then formed by conventional masking and evaporation techniques.

Furthermore, it is anticipated by the present invention that the pocket regions 120 may extend only within the second region 118. More specifically, if the etched grooves extend completely through the first region 116, then the pocket regions 120 extending from the bottom of the etched grooves extends entirely within only the second region 118. In such a configuration, the first electrode 124 could make electrical contact to the first region 116 and second region 118 and pocket regions 120 resulting in the device being electrically equivalent to a plurality of solar cell diodes in parallel.

Therefore, the photovoltaic device of the present invention enhances carrier collection efficiency by extending the PN junction deeper into the device body for a more complete and efficient collection of photogenerated carriers deep within the body.

I claim:

1. A photovoltaic device having a body of semiconductor material comprising:
   (a) a first region of semiconductor material of one conductivity type and having a predetermined degree of conductivity, said first region having an incident surface where incident radiation is capable of impinging said device;
   (b) a second region of semiconductor material of conductivity type opposite to that of said first region, contiguous to said first region and defining therewith a portion of a PN junction;
   (c) a plurality of pocket regions electrically coupled to said first region, said pocket regions being of said one conductivity type, said pocket regions defining with said second region further portions of said PN junction, said pocket regions extending from below the incident surface of said first region into said second region thereby extending said PN junction into said second region;
   (d) a first electrode in said first region electrically contacting said pocket regions and said first region; and
   (e) a second electrode on a surlface of said body opposite said incident surface.

2. The photovoltaic device in accordance with claim 1 wherein said first region is of N type conductivity, said pocket regions are of N+ type conductivity, and said second region is of P type conductivity.

3. The photovoltaic device in accordance with claim 1 wherein the center to center spacing between pocket regions is in the range of 1 to 3 diffusion lengths of carriers generated in said body.

4. The photovoltaic device in accordance with claim 1 wherein said pocket regions have greater conductivity than that of said first region.

5. A photovoltaic device having a body of semiconductor material comprising:
   (a) a first region of semiconductor material of one conductivity type and having a predetermined degree of conductivity, said first region having an incident surface where incident radiation is capable of impinging said device;
   (b) a second region of semiconductor material of conductivity type opposite to that of said first region, contiguous to said first region and defining therewith a portion of a PN junction;
   (c) a plurality of pocket regions electrically coupled to said first region, said pocket regions being of said one conductivity type, said pocket regions defining with said second region further portions of said PN junction, said pocket regions extending only into said second region thereby extending said PN junction into said second region;
   (d) a first electrode in said first region electrically contacting said first region and said pocket regions; and
   (e) a second electrode on a surface of said body opposite said incident surface.

* * * * *